United States Patent
Yamatsu et al.

(10) Patent No.: US 10,870,756 B2
(45) Date of Patent: Dec. 22, 2020

(54) ACRYLIC COMPOSITION FOR ENCAPSULATION, SHEET MATERIAL, LAMINATED SHEET, CURED OBJECT, SEMICONDUCTOR DEVICE, AND PROCESS FOR PRODUCING SEMICONDUCTOR DEVICE

(71) Applicant: Panasonic Intellectual Property Management Co., Ltd., Osaka (JP)

(72) Inventors: Shigeru Yamatsu, Osaka (JP); Kazuki Watanabe, Osaka (JP); Naoki Kanagawa, Mie (JP); Daisuke Sasaki, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 0 days.

(21) Appl. No.: 16/321,643

(22) PCT Filed: Jul. 21, 2017

(86) PCT No.: PCT/JP2017/026417
§ 371 (c)(1),
(2) Date: Jan. 29, 2019

(87) PCT Pub. No.: WO2018/030112
PCT Pub. Date: Feb. 15, 2018

(65) Prior Publication Data
US 2020/0010675 A1 Jan. 9, 2020

(30) Foreign Application Priority Data

Aug. 10, 2016 (JP) ................. 2016-157834

(51) Int. Cl.
*C08L 71/12* (2006.01)
*C08J 5/18* (2006.01)
(Continued)

(52) U.S. Cl.
CPC ............ *C08L 71/126* (2013.01); *C08J 5/18* (2013.01); *H01L 21/563* (2013.01); *H01L 21/78* (2013.01);
(Continued)

(58) Field of Classification Search
CPC .......... C08L 71/126; C08J 5/18; H01L 21/78; H01L 23/295; H01L 23/293;
(Continued)

(56) References Cited

U.S. PATENT DOCUMENTS

| 2005/0075463 A1* | 4/2005 | Zarnoch | C08F 293/005 |
| | | | 525/391 |
| 2006/0041086 A1* | 2/2006 | Birsak | C08F 222/1006 |
| | | | 525/391 |

(Continued)

FOREIGN PATENT DOCUMENTS

| JP | 2007-524736 | 8/2007 |
| JP | 2008-510059 | 4/2008 |

(Continued)

OTHER PUBLICATIONS

International Search Report of PCT application No. PCT/JP2017/026417 dated Oct. 10, 2017.

*Primary Examiner* — Dao H Nguyen
(74) *Attorney, Agent, or Firm* — Greenblum & Bernstein, P.L.C.

(57) ABSTRACT

The acrylic composition for sealing contains an acrylic compound, a polyphenylene ether resin including a radical-polymerizable substituent at a terminal, an inorganic filler, and a thermal radical polymerization initiator.

25 Claims, 6 Drawing Sheets

(51) Int. Cl.
*H01L 21/56* (2006.01)
*H01L 21/78* (2006.01)
*H01L 23/29* (2006.01)
*H01L 23/31* (2006.01)
*H01L 23/00* (2006.01)

(52) U.S. Cl.
CPC ........ *H01L 23/295* (2013.01); *H01L 23/3157* (2013.01); *H01L 24/16* (2013.01); *H01L 24/29* (2013.01); *H01L 24/32* (2013.01); *H01L 24/73* (2013.01); *H01L 24/81* (2013.01); *H01L 24/83* (2013.01); *H01L 24/92* (2013.01); *H01L 24/94* (2013.01); *C08J 2371/10* (2013.01); *C08J 2433/14* (2013.01); *H01L 2224/16225* (2013.01); *H01L 2224/2919* (2013.01); *H01L 2224/32225* (2013.01); *H01L 2224/73204* (2013.01); *H01L 2224/8121* (2013.01); *H01L 2224/8321* (2013.01); *H01L 2224/9211* (2013.01); *H01L 2924/0635* (2013.01)

(58) Field of Classification Search
CPC ..... H01L 23/3157; H01L 24/16; H01L 24/29; H01L 24/32; H01L 24/73; H01L 24/81; H01L 24/92

USPC .......... 525/391, 102; 428/141, 500; 257/788
See application file for complete search history.

(56) References Cited

U.S. PATENT DOCUMENTS

| | | |
|---|---|---|
| 2006/0135704 A1 | 6/2006 | Vallance et al. |
| 2006/0135705 A1 | 6/2006 | Vallance et al. |
| 2007/0276066 A1* | 11/2007 | Ohno .................. C08K 5/0008 524/186 |
| 2008/0254257 A1* | 10/2008 | Inoue ..................... B32B 27/04 428/141 |
| 2014/0187714 A1 | 7/2014 | Horiguchi et al. |
| 2015/0348861 A1* | 12/2015 | Chia ................ H01L 21/76898 257/774 |

FOREIGN PATENT DOCUMENTS

| | | |
|---|---|---|
| JP | 2008-524867 | 7/2008 |
| JP | 2010-258137 | 11/2010 |
| JP | 2011-140617 | 7/2011 |
| WO | 2013/035871 | 3/2013 |

* cited by examiner

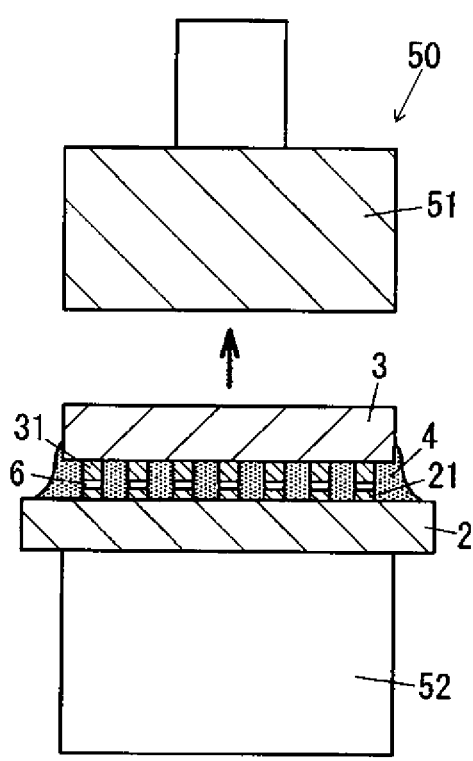

ACRYLIC COMPOSITION FOR ENCAPSULATION, SHEET MATERIAL, LAMINATED SHEET, CURED OBJECT, SEMICONDUCTOR DEVICE, AND PROCESS FOR PRODUCING SEMICONDUCTOR DEVICE

CROSS-REFERENCE TO RELATED APPLICATIONS

This application is a U.S. national stage application of the PCT International Application No. PCT/JP2017/026417 filed on Jul. 21, 2017, which claims the benefit of foreign priority of Japanese patent application No. 2016-157834 filed on Aug. 10, 2016, the contents all of which are incorporated herein by reference.

TECHNICAL FIELD

The present disclosure relates to an acrylic composition for sealing, a sheet material, a multilayer sheet, a cured product, a semiconductor device, and a method for manufacturing a semiconductor device. More specifically, the present disclosure relates to an acrylic composition for sealing suitable for sealing a gap between a substrate and a semiconductor chip by pre-applied underfilling using a sheet material, a sheet material, a multilayer sheet, a cured product of the acrylic composition for sealing, a semiconductor device including a sealing material made of the cured product, and a method for manufacturing a semiconductor device including the sealing material.

BACKGROUND

In mounting a flip-chip semiconductor chip face-down on a substrate, an underfilling technique is widely adopted. An example of the underfilling technique is a method of mounting a semiconductor chip on a substrate, and then filling a resin composition into a gap between the substrate and the semiconductor chip to seal the gap.

Along with the narrowing of pitch between bump electrodes, the pre-applied system attracts attention as an underfilling technique. In the pre-applied system, for example, a substrate having conductor wiring, a semiconductor chip having bump electrodes, and a thermosetting acrylic composition for sealing that is liquid at room temperature are prepared. The acrylic composition for sealing is disposed on the substrate, and the semiconductor chip is disposed on a position of the substrate on which the acrylic composition for sealing is disposed while the bump electrodes are disposed on the conductor wiring. In this state, the acrylic composition for sealing and the bump electrodes are heated for curing the acrylic composition for sealing to form a sealing material while electrically connecting the bump electrodes to the conductor wiring (see International Publication No. WO2013/035871).

This pre-applied system is capable of simultaneously achieving mounting of the semiconductor chip on the substrate and sealing of the gap between the semiconductor chip and the substrate. Moreover, even if the pitch between the bump electrodes is narrow, unfilling of the gap between the semiconductor chip and the substrate with the sealing material is unlikely to occur.

Known pre-applied underfilling techniques include, in addition to a technique of directly using a composition that is liquid at room temperature (non-conductive paste process, also referred to as NCP process), a technique of using a sheet material obtained by drying or half-curing a composition (non-conductive film process, also referred to as NCF process) (see Unexamined Japanese Patent Publication No. 2011-140617).

SUMMARY

An acrylic composition for sealing according to one aspect of the present disclosure contains an acrylic compound, a polyphenylene ether resin including a radical-polymerizable substituent at a terminal, an inorganic filler, and a thermal radical polymerization initiator. The acrylic composition for sealing preferably further includes a nitroxide compound. The radical-polymerizable substituent preferably includes a carbon-carbon double bond. The radical-polymerizable substituent preferably includes a structure represented by formula (1) shown below.

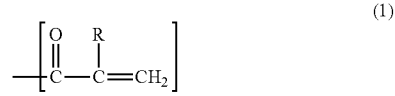

In formula (1), R is hydrogen or an alkyl group.

A sheet material according to one aspect of the present disclosure is a dried product or a half-cured product of the acrylic composition for sealing. The sheet material preferably has a minimum melt viscosity less than or equal to 200 Pa·s.

A multilayer sheet according to one aspect of the present disclosure includes the sheet material and a support sheet that supports the sheet material.

A cured product according to one aspect of the present disclosure is a thermally cured product of the acrylic composition for sealing or the sheet material. The cured product preferably has a glass transition temperature more than or equal to 170° C.

A semiconductor device according to one aspect of the present disclosure includes a substrate, a semiconductor chip mounted face-down on the substrate, and a sealing material that seals a gap between the substrate and the semiconductor chip, and the sealing material is made of the cured product.

A method for manufacturing a semiconductor device according to one aspect of the present disclosure includes the following procedure. The sheet material is overlaid on a surface of a semiconductor wafer including a bump electrode, the surface including the bump electrode. The semiconductor wafer is cut together with the sheet material to produce a member, the member including a semiconductor chip cut out from the semiconductor wafer and an individual sheet cut out from the sheet material. A substrate including a conductor wiring, the individual sheet, and the semiconductor chip are stacked in this order by overlaying the member on a surface of the substrate, the surface including the conductor wiring. The individual sheet is heated to produce a sealing material by melting and then curing the individual sheet, and to electrically connect the bump electrode to the conductor wiring.

According to the above-mentioned aspect of the present disclosure, it is possible to provide an acrylic composition for sealing that is easy to mold into a sheet, that can have a low melt viscosity, and that can be cured into a cured product having high heat resistance.

Moreover, according to the above-mentioned aspects of the present disclosure, it is possible to provide a sheet material and a multilayer sheet produced from the acrylic composition for sealing, a cured product of the acrylic composition for sealing, a semiconductor device including a sealing material made of the cured product, and a method for manufacturing a semiconductor device including the sealing material.

BRIEF DESCRIPTION OF DRAWINGS

FIG. 4D is a schematic cross-sectional view illustrating the step of mounting the semiconductor chip on the substrate according to one exemplary embodiment of the present disclosure.

DESCRIPTION OF EMBODIMENT

Figure 1:
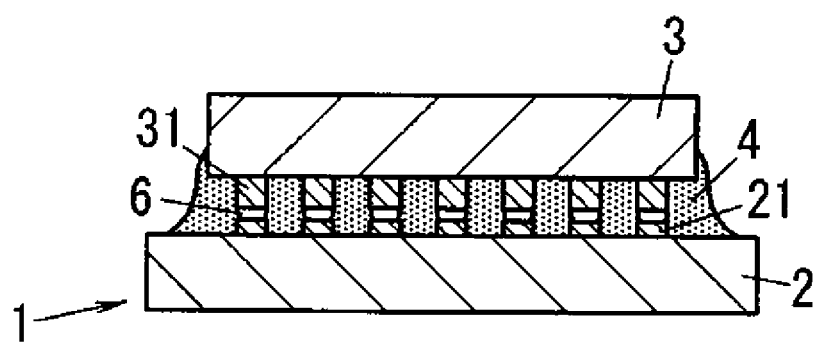
FIG. 1 is a schematic cross-sectional view illustrating a semiconductor device according to one exemplary embodiment of the present disclosure.

Prior to the description of an exemplary embodiment of the present disclosure, problems of prior techniques will be briefly described. In an attempt to achieve practical application of the NCF process using a sheet material produced from an acrylic composition for sealing, the inventors investigated, for easily molding the acrylic composition for sealing into a sheet, addition of a thermoplastic resin to the acrylic composition for sealing.

As a result of investigation made by the inventors, it was found that adding a thermoplastic resin to the acrylic composition for sealing increases the melt viscosity of a sheet material produced from the acrylic composition for sealing. Hence, defects such as unfilling and voids are likely to occur in melting the sheet material to fill a gap between a substrate and a semiconductor chip. Moreover, the thermoplastic resin lowers the heat resistance of a sealing material, and thus lowers the reliability of a semiconductor device.

The present disclosure provides an acrylic composition for sealing that is easy to mold into a sheet, that can have a low melt viscosity, and that can be cured into a cured product having high heat resistance, a sheet material and a multilayer sheet produced from the acrylic composition for sealing, a cured product of the acrylic composition for sealing, a semiconductor device including a sealing material made of the cured product, and a method for manufacturing a semiconductor device including the sealing material.

One exemplary embodiment of the present disclosure will be described below. In the present description, "(meth)acryl-" is a generic term for "acryl-" and "methacryl-". For example, "(meth)acryloyl group" is a generic term for "acryloyl group" and "methacryloyl group". In addition, "content of solid component of the acrylic composition for sealing" means an amount of component obtained by excluding volatile components such as a solvent from the acrylic composition for sealing.

The acrylic composition for sealing according to the present exemplary embodiment contains an acrylic compound (A), a polyphenylene ether resin (B) including a radical-polymerizable substituent (b1) at a terminal, an inorganic filler (C), and a thermal radical polymerization initiator (D).

The acrylic composition for sealing is easy to mold into a sheet since it contains the polyphenylene ether resin (B). In addition, sheet material 41 produced from the acrylic composition for sealing is easy to cut. Moreover, sheet material 41 can have a low melt viscosity.

Moreover, since the polyphenylene ether resin (B) includes the radical-polymerizable substituent (b1) at a terminal, the polyphenylene ether resin (B) and the acrylic compound (A) polymerize to form a macromolecule when the thermal curing of the acrylic composition for sealing is conducted. That is, the polyphenylene ether resin (B) is incorporated into a skeleton of the macromolecule. As a result, a cured product of the acrylic composition for sealing can have high heat resistance and moisture resistance.

Figure 2:
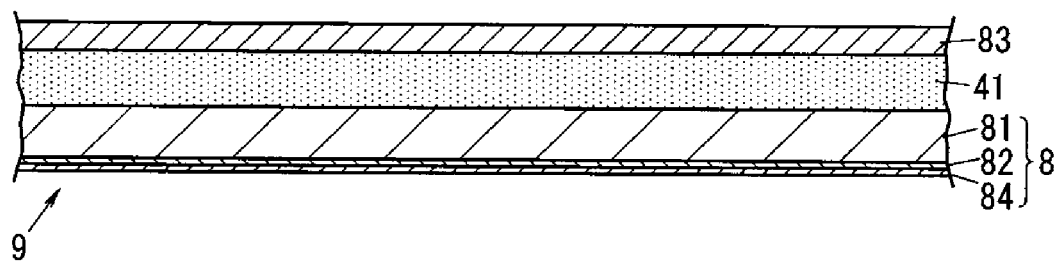
FIG. 2 is a schematic cross-sectional view illustrating a multilayer sheet according to one exemplary embodiment of the present disclosure.

Sheet material 41 can be produced from the acrylic composition for sealing (see FIG. 2). Sheet material 41 is made of a dried product or a half-cured product of the acrylic composition for sealing. The acrylic composition for sealing and sheet material 41 are suitable for producing sealing material 4 in semiconductor device 1 (see FIG. 1).

FIG. 1 shows an example of semiconductor device 1. Semiconductor device 1 includes substrate 2, semiconductor chip 3 mounted face-down on substrate 2, and sealing material 4 that seals a gap between substrate 2 and semiconductor chip 3. Sealing material 4 is made of a cured product of the acrylic composition for sealing or sheet material 41. Semiconductor chip 3 includes, on a surface thereof facing substrate 2, bump electrode 31. And substrate 2 includes, on a surface thereof facing semiconductor chip 3, conductor wiring 21. Bump electrode 31 and conductor wiring 21 are aligned and connected to each other via solder bump 6. Bump electrode 31 and conductor wiring 21 are embedded in sealing material 4.

The present exemplary embodiment will be described in more detail. First, the composition of the acrylic composition for sealing will be described in more detail.

As described above, the acrylic composition for sealing contains the acrylic compound (A), the polyphenylene ether resin (B), the inorganic filler (C), and the thermal radical polymerization initiator (D).

In the present exemplary embodiment, the acrylic compound (A) is a compound having a (meth)acryloyl group. That is, the acrylic compound (A) is a compound having at least one of an acryloyl group and a methacryloyl group. The acrylic compound (A) may contain, for example, at least one of a monomer and an oligomer.

When the acrylic composition for sealing contains the acrylic compound (A), voids are less likely to be generated in sealing material 4 produced from the acrylic composition for sealing. This is probably because the acrylic composition for sealing is thickened at an initial stage when the acrylic compound (A) is cured by a radical polymerization reaction.

In order to ensure the heat resistance of sealing material 4, the acrylic compound (A) preferably contains a compound having two or more (meth)acryloyl groups per molecule, more preferably contains a compound having two to six (meth)acryloyl groups per molecule, and still more preferably contains a compound having two (meth)acryloyl groups per molecule.

Examples of the compound having two (meth)acryloyl groups per molecule include ethylene glycol di(meth)acrylate, 1,4-butanediol di(meth)acrylate, 1,6-hexanediol di(meth)acrylate, 1,9-nonanediol di(meth)acrylate, 1,3-butanediol di(meth)acrylate, neopentyl glycol di(meth)acrylate, dimer diol di(meth)acrylate, dimethylol tricyclodecane di(meth)acrylate, diethylene glycol di(meth)acrylate, triethylene glycol di(meth)acrylate, tetraethylene glycol di(meth)acrylate, polyethylene glycol di(meth)acrylate, tripropylene glycol di(meth)acrylate, polypropylene glycol di(meth)acrylate, glycerol di(meth)acrylate, trimethylolpropane di(meth)acrylate, pentaerythritol di(meth)acrylate, zinc di(meth)acrylate, cyclohexanediol di(meth)acrylate, cyclohexanedimethanol di(meth)acrylate, cyclohexanediethanol di(meth)acrylate, cyclohexane dialkyl alcohol di(meth)acrylate, and dimethanol tricyclodecane di(meth)acrylate.

Examples of the compound having two (meth)acryloyl groups per molecule also include a reaction product of 1 mol of bisphenol A, bisphenol F, or bisphenol AD with 2 mol of glycidyl acrylate, and a reaction product of 1 mol of bisphenol A, bisphenol F, or bisphenol AD with 2 mol of glycidyl methacrylate.

Examples of the compound having two or more (meth)acryloyl groups per molecule include a (meth)acrylate having a crosslinked polycyclic structure. Specific examples of the compound having two or more (meth)acryloyl groups per molecule include a compound represented by formula (I) shown below and a compound represented by formula (II) shown below. When the acrylic composition for sealing contains at least one of the compound represented by formula (I) shown below and the compound represented by formula (II) shown below, the heat resistance of sealing material 4 is particularly improved.

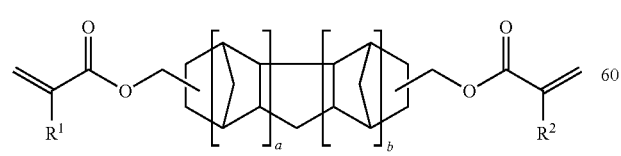
(I)

In formula (I), $R^1$ and $R^2$ are each independently a hydrogen atom or a methyl group, a is 1 or 2, and b is 0 or 1.

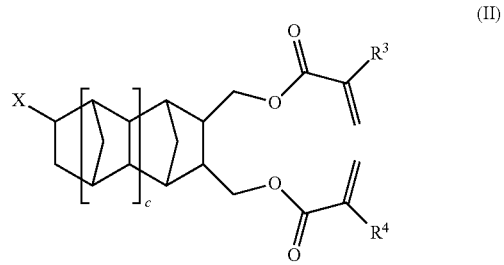
(II)

In formula (II), $R^3$ and $R^4$ are each independently a hydrogen atom or a methyl group, X is a hydrogen atom, a methyl group, a methylol group, an amino group, or a (meth)acryloyloxymethyl group, and c is 0 or 1.

More specific examples of the (meth)acrylate having a crosslinked polycyclic structure include a (meth)acrylate of formula (I) that has a dicyclopentadiene skeleton and in which a is 1 and b is 0, a (meth)acrylate of formula (II) that has a perhydro-1,4:5,8-dimethanonaphthalene skeleton and in which c is 1, a (meth)acrylate of formula (II) that has a norbornane skeleton and in which c is 0, dicyclopentadienyl diacrylate (tricyclodecane dimethanol diacrylate) of formula (I) in which $R^1$ and $R^2$ are each a hydrogen atom, a=1, and b=0, perhydro-1,4:5,8-dimethanonaphthalene-2,3,7-trimethylol triacrylate of formula (II) in which X is an acryloyloxymethyl group, $R^3$ and $R^4$ are each a hydrogen atom, and c is 1, norbornane dimethylol diacrylate of formula (II) in which X, $R^3$, and $R^4$ are each a hydrogen atom, and c is 0, and perhydro-1,4:5,8-dimethanonaphthalene-2,3-dimethylol diacrylate of formula (II) in which X, $R^3$, and $R^4$ are each a hydrogen atom and c is 1. In particular, it is preferable that the (meth)acrylate having a crosslinked polycyclic structure include at least one of dicyclopentadienyl diacrylate and norbornane dimethylol diacrylate.

Examples of the compound having two or more (meth)acryloyl groups include a di(meth)acrylate having a structure in which an alkylene oxide is added to a bisphenol skeleton. More specific examples of the compound having two or more (meth)acryloyl groups include a compound represented by formula (III) and a compound represented by formula (IV). When the acrylic compound (A) contains at least one of the compound represented by formula (III) and the compound represented by formula (IV), the adhesiveness between sealing material 4 and semiconductor chip 3 as well as between sealing material 4 and substrate 2 is improved.

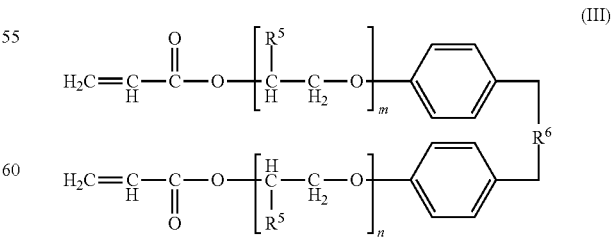
(III)

In formula (III), $R^5$ represents hydrogen, a methyl group, or an ethyl group, $R^6$ represents a divalent organic group, and m and n each represent an integer of 1 to 20.

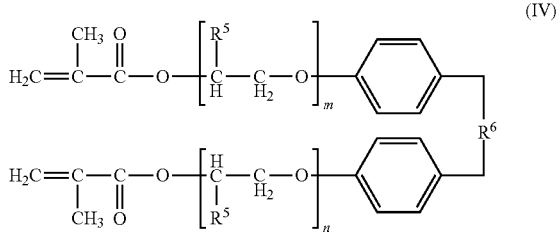

(IV)

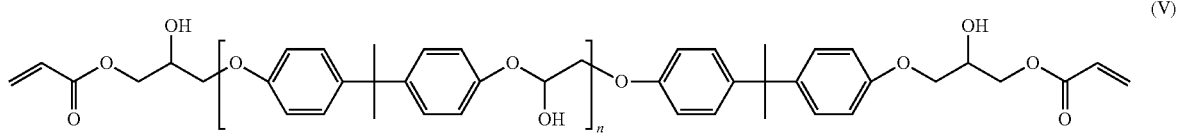

(V)

In formula (IV), $R^5$ represents hydrogen, a methyl group, or an ethyl group, $R^6$ represents a divalent organic group, and m and n each represent an integer of 1 to 20.

More specific examples of the di(meth)acrylate having a structure in which an alkylene oxide is added to a bisphenol skeleton include: EO-modified bisphenol A di(meth)acrylates (n=2 to 20) such as ARONIX M-210 and M-211B (manufactured by TOAGOSEI Co., Ltd.), and NK Ester ABE-300, A-BPE-4, A-BPE-6, A-BPE-10, A-BPE-20, A-BPE-30, BPE-100, BPE-200, BPE-500, BPE-900, and BPE-1300N (manufactured by Shin Nakamura Chemical Co., Ltd.); EO-modified bisphenol F di(meth)acrylates (n=2 to 20) such as ARONIX M-208 (manufactured by TOAGOSEI Co., Ltd.); PO-modified bisphenol A di(meth)acrylates (n=2 to 20) such as Denacol Acrylate DA-250 (manufactured by Nagase Chemicals LTD.) and Viscoat 540 (manufactured by Osaka Organic Chemical Industry Ltd.); and PO-modified phthalic acid diacrylates such as Denacol Acrylate DA-721 (manufactured by Nagase Chemicals LTD.).

The compound having two or more (meth)acryloyl groups preferably contains an epoxy (meth)acrylate. That is, the acrylic compound (A) preferably contains an epoxy (meth)acrylate. In this case, particularly when the acrylic composition for sealing contains an epoxy resin, the reactivity of the acrylic composition for sealing is improved, and the heat resistance and adhesiveness of sealing material 4 are improved.

An epoxy (meth)acrylate is an oligomer that is an addition reaction product of, for example, an epoxy resin and an unsaturated monobasic acid such as acrylic acid or methacrylic acid.

The epoxy resin that is a raw material of the epoxy (meth)acrylate contains a diglycidyl compound (bisphenol epoxy resin) obtained by condensation of a bisphenol typified by bisphenol A and bisphenol F with epihalohydrin. The epoxy resin may contain an epoxy resin having a phenol skeleton. Examples of the epoxy resin having a phenol skeleton include polyglycidyl ethers (phenol novolac epoxy resins and cresol novolac epoxy resins) obtained by condensation of a phenol novolac, a condensation product of a phenol or a cresol with an aldehyde typified by formalin, with epihalohydrin. The epoxy resin may contain an epoxy resin having a cyclohexyl ring.

The epoxy (meth)acrylate preferably contains, for example, a bisphenol A epoxy acrylate that is a solid or a liquid having a viscosity more than or equal to 10 Pa·s at 25° C. The bisphenol A epoxy acrylate is represented, for example, by formula (V) shown below.

In formula (V), n represents a positive integer.

Examples of commercial products of the bisphenol A epoxy acrylate include Denacol Acrylate DA-250 (Nagase Chemicals LTD., 60 Pa·s at 25° C.), Denacol Acrylate DA-721 (Nagase Chemicals LTD., 100 Pa·s at 25° C.), Ripoxy VR-60 (SHOWA HIGHPOLYMER CO., LTD., solid at room temperature), and Ripoxy VR-77 (SHOWA HIGHPOLYMER CO., LTD., 100 Pa·s at 25° C.).

When the acrylic compound (A) contains a compound having three or more (meth)acryloyl groups per one molecule, examples of the compound having three or more (meth)acryloyl groups include pentaerythritol triacrylate, pentaerythritol tetraacrylate, pentaerythritol pentaacrylate, ethoxylated (3) trimethylolpropane triacrylate, ethoxylated (6) trimethylolpropane triacrylate, ethoxylated (9) trimethylolpropane triacrylate, propoxylated (6) trimethylolpropane triacrylate, propoxylated (3) glyceryl triacrylate, high-propoxylated (55) glyceryl triacrylate, ethoxylated (15) trimethylolpropane triacrylate, trimethylolpropane trimethacrylate, tetraethylene glycol diacrylate, dimethylol propane tetraacrylate, tripropylene glycol diacrylate, pentaacrylate ester, 1,3-adamantanediol dimethacrylate, 1,3-adamantanediol diacrylate, 1,3-adamantane dimethanol dimethacrylate, and 1,3-adamantane dimethanol diacrylate.

The acrylic compound (A) contains, for example, the (meth)acrylate having a crosslinked polycyclic structure at a proportion ranging from 10% by mass to 50% by mass both inclusive in the whole acrylic compound (A). In addition, the acrylic compound (A) contains the di(meth)acrylate having a structure in which an alkylene oxide is added to a bisphenol skeleton at a proportion ranging from 3% by mass to 20% by mass both inclusive in the whole acrylic compound (A). Moreover, the acrylic compound (A) may contain the epoxy (meth)acrylate at a proportion ranging from 5% by mass to 30% by mass both inclusive in the whole acrylic compound (A).

The acrylic compound (A) may contain various vinyl monomers other than the above-mentioned components, for example, a monofunctional vinyl monomer.

The ratio of the acrylic compound (A) with respect to 100 parts by mass of the total amount of the acrylic compound (A) and the polyphenylene ether resin (B), for example, ranges from 30 parts by mass to 55 parts by mass both inclusive.

The polyphenylene ether resin (B) will be described. As described above, the polyphenylene ether resin (B) has the radical-polymerizable substituent (b1) at a terminal. The polyphenylene ether resin (B) has, for example, a polyphenylene ether chain (b2) and the substituent (b1) bonded to a terminal of the polyphenylene ether chain (b2).

The structure of the substituent (b1) is not particularly limited as long as it has radical polymerizability. Examples of the substituent (b1) include a group having a carbon-carbon double bond.

The substituent (b1) is preferably a group having a carbon-carbon double bond. In this case, the substituent (b1) reacts with the acrylic compound (A) so that the polyphenylene ether resin (B) is incorporated into a skeleton of a macromolecule, and as a result, a cured product of the acrylic composition for sealing can have high heat resistance and moisture resistance.

The substituent (b1) has, for example, a structure represented by formula (1) shown below or a structure represented by formula (2) shown below.

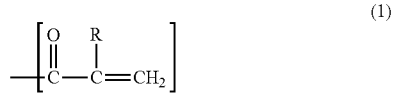

(1)

In formula (1), R is hydrogen or an alkyl group. When R is an alkyl group, the alkyl group is preferably a methyl group.

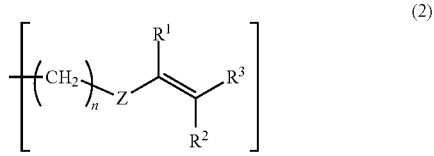

(2)

In formula (2), n is an integer of 0 to 10, for example, n=1. In formula (2), Z is an arylene group, and $R^1$ to $R^3$ are each independently hydrogen or an alkyl group. When n in formula (2) is 0, Z is directly bonded to a terminal of the polyphenylene ether chain (b2) in the polyphenylene ether resin (B).

The substituent (b1) particularly preferably has the structure represented by formula (1).

The polyphenylene ether resin (B) contains, for example, a compound having a structure represented by formula (3) shown below.

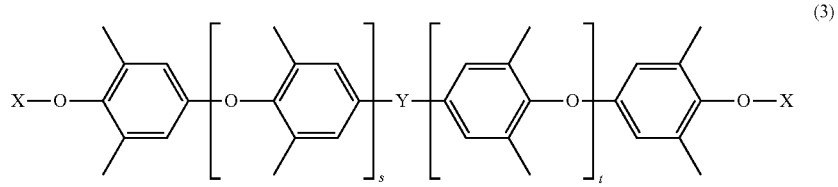

(3)

In formula (3), Y is an alkylene group having 1 to 3 carbon atoms or a direct bond. Y is, for example, a dimethylmethylene group. In formula (3), X is the substituent (b1), for example, the group having the structure represented by formula (1) or the group having the structure represented by formula (2). It is particularly preferable that X be the group having the structure represented by formula (1). In formula (3), s is a number of 0 or more, t is a number of 0 or more, and the sum of s and t is a number of 1 or more. s is preferably a number ranging from 0 to 20 both inclusive, t is preferably a number ranging from 0 to 20 both inclusive, and the sum of s and t is preferably a number ranging from 1 to 30 both inclusive.

The proportion of the polyphenylene ether resin (B) in the total amount of the acrylic compound (A) and the polyphenylene ether resin (B) preferably ranges from 30% by mass to 85% by mass both inclusive. When the proportion is more than or equal to 30% by mass, the cured product can have higher heat resistance. When the proportion is less than or equal to 85% by mass, the cured product can have higher flexibility. The proportion more preferably ranges from 45% by mass to 70% by mass both inclusive.

The acrylic composition for sealing may further contain a thermosetting compound other than the acrylic compound (A) and the polyphenylene ether resin (B). An example of the thermosetting compound is a compound that causes a thermal curing reaction with the acrylic compound (A). Specific examples of the thermosetting compound include a bismaleimide resin.

The acrylic composition for sealing may contain an elastomer. Examples of the elastomer include a maleic anhydride adduct of an isoprene polymer.

The acrylic composition for sealing may contain a small amount of thermoplastic resin. Examples of the thermoplastic resin include a methyl methacrylate-n-butyl methacrylate copolymer.

The inorganic filler (C) will be described. The inorganic filler (C) can adjust the thermal expansion coefficient of sealing material 4. The inorganic filler (C) can also improve the thermal conductivity of sealing material 4, whereby heat generated from semiconductor chip 3 can be efficiently dissipated through sealing material 4.

The inorganic filler (C) may contain one or more materials selected from the group consisting of: silica powders such as fused silica, synthetic silica, and crystalline silica; oxides such as alumina and titanium oxide; silicates such as talc, fired clay, unfired clay, mica, and glass; carbonates such as calcium carbonate, magnesium carbonate, and hydrotalcite; hydroxides such as aluminum hydroxide, magnesium hydroxide, and calcium hydroxide; sulfates and sulfites such as barium sulfate, calcium sulfate, and calcium sulfite; borates such as zinc borate, barium metaborate, aluminum borate, calcium borate, and sodium borate; and nitrides such as aluminum nitride, boron nitride, and silicon nitride. The fused silica may be either fused spherical silica or fused crushed silica. The inorganic filler (C) particularly preferably contains at least one of silica and alumina.

The shape of the inorganic filler (C) may be crushed, acicular, scaly, or spherical, and is not particularly limited. For improving the dispersibility of the inorganic filler (C) in the acrylic composition for sealing and controlling the viscosity of the acrylic composition for sealing, the inorganic filler (C) is preferably spherical.

The inorganic filler (C) preferably has an average particle size that is smaller than a dimension of a space between substrate 2 and semiconductor chip 3 mounted on substrate 2.

In order to improve the packing density of the inorganic filler (C) in the acrylic composition for sealing and sealing material 4 and to adjust the viscosity of the acrylic composition for sealing, the average particle size of the inorganic filler (C) is preferably less than or equal to 5 µm, more preferably less than or equal to 1 µm, still more preferably less than or equal to 0.5 µm, and particularly preferably ranges from 0.1 µm to 0.3 µm both inclusive.

The average particle size in the present exemplary embodiment is a median diameter calculated from the result of particle size distribution measurement by a laser light diffraction method.

For adjusting the viscosity of the acrylic composition for sealing or adjusting the physical properties of sealing material 4, the inorganic filler (C) may contain two or more components different in average particle size.

The proportion of the inorganic filler (C) in the content of solid component of the acrylic composition for sealing, for example, ranges from 10% by mass to 90% by mass both inclusive.

The thermal radical polymerization initiator (D) contains, for example, an organic peroxide. The organic peroxide has a one-minute half-life temperature preferably ranging from 120° C. to 195° C. both inclusive, more preferably ranging from 150° C. to 190° C. both inclusive. In this case, the acrylic composition for sealing quickly thickens to such an extent that the wettability between bump electrode 31 and conductor wiring 21 is not inhibited at an initial stage of a step of thermally curing the acrylic composition for sealing, so that the generation of voids is suppressed. In addition, the curing reaction of the acrylic composition for sealing proceeds sufficiently quickly, so that delamination between semiconductor chip 3 and sealing material 4 can be suppressed.

Specific examples of the organic peroxide include t-butyl peroxy-2-ethylhexyl monocarbonate (one-minute half-life temperature: 161.4° C.), t-butyl peroxybenzoate (one-minute half-life temperature: 166.8° C.), t-butyl cumylperoxide (one-minute half-life temperature: 173.3° C.), dicumyl peroxide (one-minute half-life temperature: 175.2° C.), α,α'-di(t-butylperoxy) diisopropylbenzene (one-minute half-life temperature: 175.4° C.), 2,5-dimethyl-2,5-di(t-butylperoxy) hexane (one-minute half-life temperature: 179.8° C.), di-t-butylperoxide (one-minute half-life temperature: 185.9° C.), and 2,5-dimethyl-2,5-bis(t-butylperoxy) hexyne (one-minute half-life temperature: 194.3° C.).

The ratio of the thermal radical polymerization initiator (D) with respect to 100 parts by mass of the total amount of the acrylic compound (A) and the polyphenylene ether resin (B) preferably ranges from 0.25 parts by mass to 2.0 parts by mass both inclusive. In this case, the cured product can have good physical properties. The ratio of the thermal radical polymerization initiator (D) more preferably ranges from 0.5 parts by mass to 1.5 parts by mass both inclusive.

The acrylic composition for sealing preferably contains a radical scavenger. When the acrylic composition for sealing contains a radical scavenger, even if the acrylic composition for sealing is heated to generate radicals therein, the radical scavenger can scavenge the radicals. Accordingly, the progress of the thermal radical reaction in the acrylic composition for sealing can be suppressed. Therefore, when the acrylic composition for sealing is heated and melted, the thermal radical reaction is suppressed. This makes it possible to maintain a low-viscosity state of the acrylic composition for sealing for a long time. Therefore, in the production of sealing material 4 using sheet material 41 made of the acrylic composition for sealing, when sheet material 41 is heated and melted, a low-viscosity state of molten sheet material 41 can be maintained for a long time. As a result, defects such as unfilling and voids are further less likely to occur. Moreover, since sheet material 41 does not cure immediately after being heated, even if sheet material 41 is heated before being disposed between the semiconductor element and substrate 2, defects are unlikely to occur. Therefore, handleability of sheet material 41 is improved. Moreover, also in a case where sealing material 4 is produced from the acrylic composition for sealing without production of sheet material 41 from the acrylic composition for sealing, when the acrylic composition for sealing is heated, a low-viscosity state of the acrylic composition for sealing can be maintained for a long time, and as a result, defects can be suppressed.

Examples of the radical scavenger include a nitroxide compound (E) and a carbonylthio compound. In particular, it is preferable that the radical scavenger contain the nitroxide compound (E), that is, the acrylic composition for sealing contain the nitroxide compound (E). When the acrylic composition for sealing contains the nitroxide compound (E), during heating and melting of the acrylic composition for sealing, the progress of the initial thermal radical reaction is moderately suppressed, and as a result, the effects of suppressing defects and improving the handleability are particularly remarkable.

The nitroxide compound (E) may contain, for example, at least one component selected from the group consisting of 2,2,6,6-tetramethyl-1-piperidinoxy free radical (TEMPO), 4-acetamido-2,2,6,6-tetraethylpiperidine-1-oxy free radical, 4-amino-2,2,6,6-tetramethylpiperidine-1-oxy free radical, 4-carboxy-2,2,6,6-tetramethylpiperidine-1-oxy free radical, 4-oxo-2,2,6,6-tetramethylpiperidine-1-oxy free radical, 4-methacryloyloxy-2,2,6,6-tetramethylpiperidine-1-oxy free radical, and [[N,N'-[adamantane-2-ylidenebis(1,4-phenylene)]bis(tert-butylamine)]-N,N'-diylbisoxy] radical.

The proportion of the nitroxide compound (E) to the thermal radical polymerization initiator (D) preferably ranges from 2.5% by mass to 20% by mass both inclusive. When the proportion of the nitroxide compound (E) is more than or equal to 2.5% by mass, a low-viscosity state of sheet material 41 or the acrylic composition for sealing can be maintained for a sufficiently long time upon heating of sheet material 41 or the acrylic composition for sealing. In addition, when the proportion of the nitroxide compound (E) is less than or equal to 20% by mass, brittleness of sealing material 4 is suppressed. The proportion of the nitroxide compound (E) particularly preferably ranges from 5% by mass to 10% by mass both inclusive.

The acrylic composition for sealing may contain a flux. Examples of the flux include an organic acid. When the acrylic composition for sealing contains an organic acid, an oxide film on a surface of bump electrode 31 is removed at the time of reflowing owing to the action of the organic acid, and good connection reliability between semiconductor chip 3 and substrate 2 is ensured. The organic acid may contain, for example, one or more compounds selected from the group consisting of sebacic acid, abietic acid, glutaric acid, succinic acid, malonic acid, oxalic acid, adipic acid, pimelic acid, suberic acid, azelaic acid, diglycolic acid, thiodiglycolic acid, phthalic acid, isophthalic acid, terephthalic acid, propanetricarboxylic acid, citric acid, benzoic acid, and tartaric acid. The proportion of the organic acid in the content of solid component of the acrylic composition for sealing preferably ranges from 0.1% by mass to 20% by mass both inclusive, more preferably ranges from 0.1% by mass to 10% by mass both inclusive.

The acrylic composition for sealing may contain maleic acid-modified polybutadiene. When the acrylic composition for sealing contains maleic acid-modified polybutadiene, the adhesiveness between sealing material 4 and substrate 2 can be particularly improved. The proportion of the maleic acid-modified polybutadiene in the acrylic compound (A) preferably ranges from 10% by mass to 30% by mass both inclusive.

The acrylic composition for sealing may contain a solvent. The solvent contains, for example, at least one component selected from the group consisting of methanol, ethanol, ethylene glycol monomethyl ether, ethylene glycol monoethyl ether, ethylene glycol monobutyl ether, methyl ethyl ketone, acetone, isopropyl acetone, toluene, and xylene. The amount of the solvent is appropriately decided so that the acrylic composition for sealing may have a moderate viscosity.

The acrylic composition for sealing may contain additives other than the above-mentioned components to the extent that the effects of the present exemplary embodiment are not impaired. Examples of the additives include a silane coupling agent, an antifoaming agent, a leveling agent, a low stress agent, and a pigment.

The acrylic composition for sealing is prepared, for example, by the following method.

First, components of the acrylic composition for sealing other than the inorganic filler (C) are simultaneously or sequentially compounded to give a mixture. The mixture is stirred with heating or cooling as necessary. Then, the inorganic filler (C) is added to the mixture. Then, the mixture is stirred again with heating or cooling as necessary. By this procedure, an acrylic composition for sealing can be obtained. For stirring the mixture, for example, a disper, a planetary mixer, a ball mill, a three-roll mill, a bead mill or the like can be used in combination as necessary.

From the acrylic composition for sealing, sheet material 41 can be produced. Sheet material 41 and multilayer sheet 9 including sheet material 41 will be described in detail with reference to FIG. 2.

Sheet material 41 is a dried product or a half-cured product of the acrylic composition for sealing. The "dried product of the acrylic composition for sealing" is a product obtained by removing volatile components such as the solvent from the acrylic composition for sealing, and is not completely cured. The "half-cured product of the acrylic composition for sealing" is a product obtained by curing the acrylic composition for sealing to some extent by a curing reaction, and is not completely cured.

In the case of producing sheet material 41, for example, first, the acrylic composition for sealing and support sheet 8 are prepared. Support sheet 8 is appropriate plastic sheet 81 made from, for example, polyethylene terephthalate.

Support sheet 8 may include plastic sheet 81 and adhesive layer 82 overlaid on plastic sheet 81. Adhesive layer 82 is a layer having moderate adhesive strength, and can be used for fixing support sheet 8 to appropriate table 10 (see FIG. 3A). Adhesive layer 82 may have reaction curability. In this case, support sheet 8 can be firmly fixed to table 10 by disposing support sheet 8 on appropriate table 10 and then curing adhesive layer 82. Adhesive layer 82 can be produced from, for example, an acrylic resin, synthetic rubber, natural rubber, or a polyimide resin.

The acrylic composition for sealing is applied to one surface of support sheet 8. When support sheet 8 includes plastic sheet 81 and adhesive layer 82, the acrylic composition for sealing is applied to a surface of plastic sheet 81 reverse to adhesive layer 82. Then, the acrylic composition for sealing is heated on support sheet 8 to be dried or half-cured. The heating conditions for the acrylic composition for sealing in this process is, for example, preferably a heating temperature ranging from 80° C. to 120° C. both inclusive and a heating time ranging from 5 minutes to 30 minutes both inclusive. In this manner, sheet material 41 can be produced on support sheet 8, and multilayer sheet 9 including sheet material 41 and support sheet 8 that supports sheet material 41 is obtained. In the present exemplary embodiment, since the acrylic composition for sealing contains the polyphenylene ether resin (B), it is easy to mold the acrylic composition for sealing into a sheet, so that sheet material 41 can be easily produced.

The thickness of sheet material 41, for example, ranges from 10 μm to 50 μm both inclusive. The thickness, however, is not limited thereto and may be an appropriate value in accordance with the thickness of sealing material 4 in semiconductor device 1.

Sheet material 41 preferably has a minimum melt viscosity less than or equal to 200 Pa·s. In other words, the dried product or half-cured product of the acrylic composition for sealing preferably has a minimum melt viscosity less than or equal to 200 Pa·s. In this case, in the production of sealing material 4 from sheet material 41, defects such as unfilling and voids are particularly less likely to occur. The minimum melt viscosity of sheet material 41 more preferably ranges from 10 Pa·s to 200 Pa·s both inclusive, and still more preferably ranges from 50 Pa·s to 150 Pa·s both inclusive. The low melt viscosity of sheet material 41 within the above-mentioned range can be easily achieved by appropriately adjusting the composition of the acrylic composition for sealing if the polyphenylene ether resin (B) is added, and further the nitroxide compound (E) is added to the acrylic composition for sealing as in the present exemplary embodiment. The minimum melt viscosity of sheet material 41 is the lowest viscosity of sheet material 41 within a range of 25° C. to 300° C. both inclusive, and is measured using a rheometer (product name: AR2000ex) manufactured by TA Instruments Japan Inc. In the measurement of the minimum melt viscosity, for example, a plate made of aluminum and having a diameter of 25 mm is used, and the minimum melt viscosity is measured under the conditions of a sample thickness of 300 to 400 μm, a measurement gap of 300 μm, a heating rate of 100° C./sec, a number of revolutions of 2 rpm, and a temperature range of 25° C. to 300° C.

As shown in FIG. 2, multilayer sheet 9 may further include protective film 83 for covering sheet material 41. The material of protective film 83 is not particularly limited. When support sheet 8 includes adhesive layer 82, as shown in FIG. 2, multilayer sheet 9 may further include cover sheet 84 for covering adhesive layer 82. The material of cover sheet 84 is also not particularly limited.

The acrylic composition for sealing or sheet material 41 is thermally cured to give a cured product. The cured product can have high heat resistance and moisture resistance as described above.

The cured product has, for example, a glass transition temperature more than or equal to 150° C. In the present exemplary embodiment, the cured product particularly preferably has a glass transition temperature more than or equal to 170° C. In this case, the cured product can have particularly high heat resistance, so that semiconductor device 1 including sealing material 4 made of the cured product can have high heat resistance reliability. The glass transition temperature within the above-mentioned range can be easily achieved by appropriately adjusting the composition of the acrylic composition for sealing if the polyphenylene ether resin (B) is added to the acrylic composition for sealing as in the present exemplary embodiment.

The acrylic composition for sealing and sheet material 41 are suitable as an underfill material. Pre-applied underfilling using the acrylic composition for sealing or sheet material 41 can seal the gap between substrate 2 and semiconductor chip 3, so that semiconductor device 1 can be produced.

An example of a method for manufacturing semiconductor device 1 will be described with reference to FIGS. 3A to 3C and FIGS. 4A to 4D.

First, multilayer sheet 9, substrate 2, and semiconductor wafer 32 are prepared.

Substrate 2 is, for example, a mother substrate, a package substrate, or an interposer substrate. For example, substrate 2 includes an insulating substrate made of glass epoxy, polyimide, polyester, ceramic or the like, and electrically conductive conductor wiring 21 made of copper or the like and formed on a surface of the insulating substrate.

Semiconductor wafer 32 is, for example, a silicon wafer. On semiconductor wafer 32, a circuit is formed by an appropriate method such as photolithography. On one surface of semiconductor wafer 32, bump electrode 31 connected to the circuit is provided.

In the present exemplary embodiment, bump electrode 31 on semiconductor wafer 32 has solder bump 6. Conductor wiring 21 of substrate 2, instead of bump electrode 31, may have solder bump 6, or both of bump electrode 31 and conductor wiring 21 may have solder bump 6. In other words, it is required that at least one of bump electrode 31 of semiconductor wafer 32 and conductor wiring 21 of substrate 2 have solder bump 6. Solder bump 6 is preferably made of lead-free solder having a melting point more than or equal to 210° C., such as Sn-3.5Ag (melting point: 221° C.), Sn-2.5Ag-0.5Cu-1Bi (melting point: 214° C.), Sn-0.7Cu (melting point: 227° C.), and Sn-3Ag-0.5Cu (melting point: 217° C.).

Then, sheet material 41 in multilayer sheet 9 is overlaid on a surface of semiconductor wafer 32 on which bump electrode 31 is disposed. In this process, protective film 83 is removed from sheet material 41 in multilayer sheet 9, and then sheet material 41 overlaid on support sheet 8 is overlaid on the surface of semiconductor wafer 32 on which bump electrode 31 is disposed.

Figure 3A:
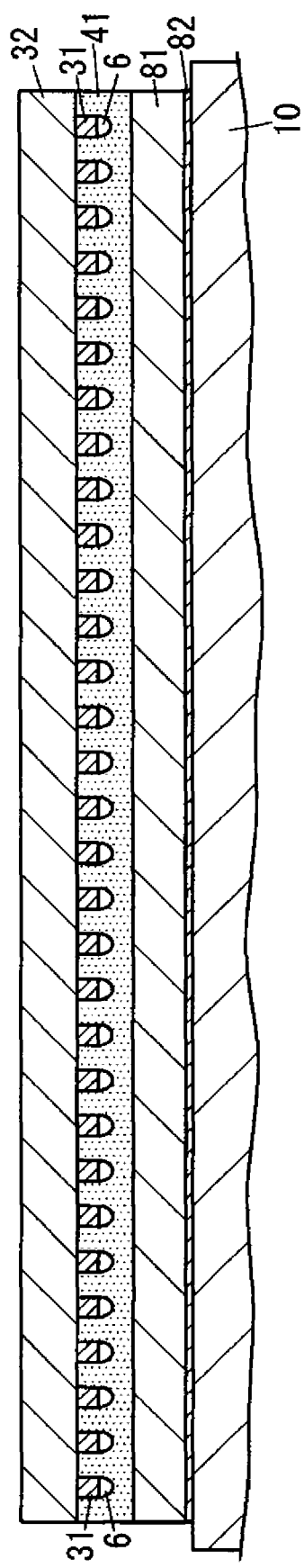
FIG. 3A is a schematic cross-sectional view illustrating a step of producing a chip member from a semiconductor wafer and a sheet material according to one exemplary embodiment of the present disclosure.

Then, semiconductor wafer 32 is cut together with sheet material 41 so that semiconductor wafer 32 is diced. In this process, for example, cover sheet 84 is removed from adhesive layer 82 in support sheet 8, then adhesive layer 82 is disposed on table 10, and adhesive layer 82 is further cured as necessary. In this manner, as shown in FIG. 3A, support sheet 8 is fixed to table 10 in a state where sheet material 41 is overlaid on support sheet 8.

Figure 3B:
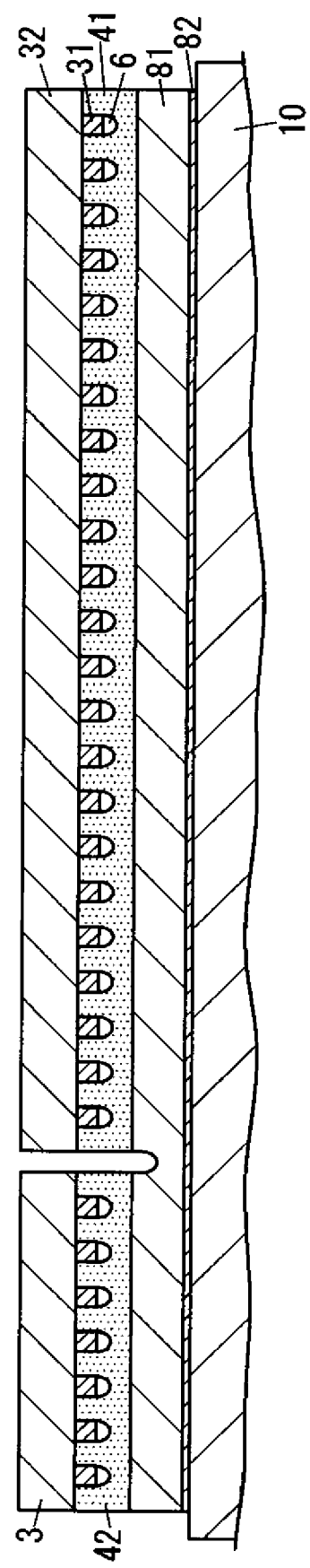
FIG. 3B is a schematic cross-sectional view illustrating the step of producing the chip member from the semiconductor wafer and the sheet material according to one exemplary embodiment of the present disclosure.
Figure 3C:
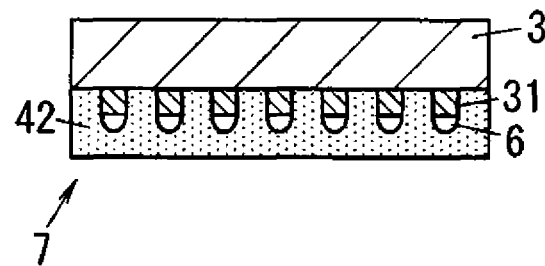
FIG. 3C is a schematic cross-sectional view illustrating the step of producing the chip member from the semiconductor wafer and the sheet material according to one exemplary embodiment of the present disclosure.

In this state, as shown in FIG. 3B, semiconductor wafer 32 is cut together with sheet material 41. By this procedure, a member (hereinafter referred to as chip member 7) including semiconductor chip 3 cut out from semiconductor wafer 32 and individual sheet 42 cut out from sheet material 41 is produced. Chip member 7 is removed from support sheet 8. As shown in FIG. 3C, semiconductor chip 3 in chip member 7 has bump electrode 31. And individual sheet 42 is overlaid on a surface of semiconductor chip 3 on which bump electrode 31 is disposed.

Then, semiconductor chip 3 is mounted face-down on substrate 2. In the present exemplary embodiment, the semiconductor chip is mounted on the substrate as follows using flip chip bonder 50 including bonding head 51 and stage 52.

Figure 4A:
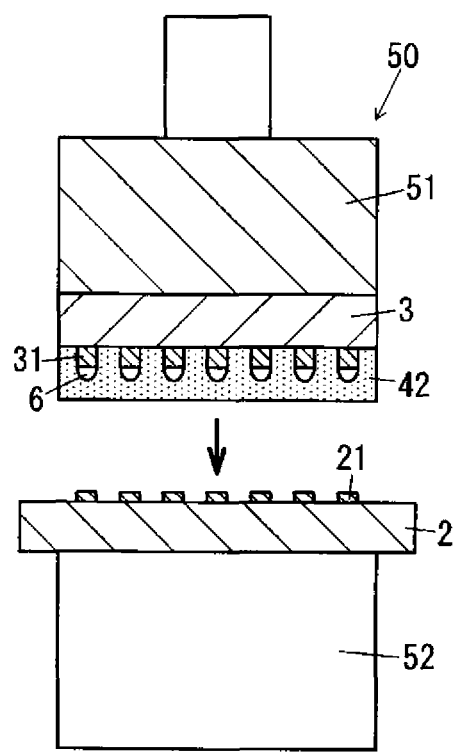
FIG. 4A is a schematic cross-sectional view illustrating a step of mounting a semiconductor chip on a substrate according to one exemplary embodiment of the present disclosure.
Figure 4B:
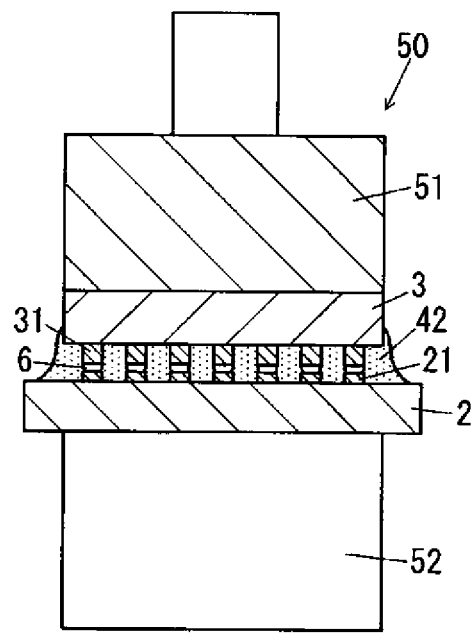
FIG. 4B is a schematic cross-sectional view illustrating the step of mounting the semiconductor chip on the substrate according to one exemplary embodiment of the present disclosure.

As shown in FIG. 4A, substrate 2 is supported by stage 52, and semiconductor chip 3 in chip member 7 is held by bonding head 51. In this state, bonding head 51 is moved toward stage 52 as shown in FIG. 4B. By this procedure, semiconductor chip 3 is disposed on substrate 2. In this process, semiconductor chip 3 and substrate 2 are aligned so that bump electrode 31 of semiconductor chip 3 and conductor wiring 21 of substrate 2 overlap each other.

Figure 4C:
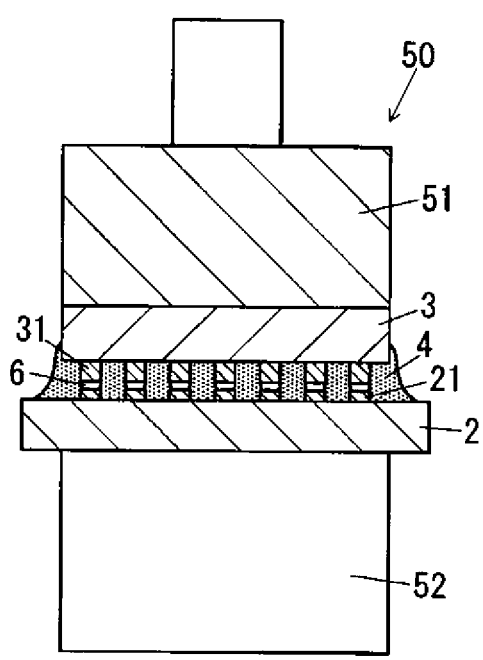
FIG. 4C is a schematic cross-sectional view illustrating the step of mounting the semiconductor chip on the substrate according to one exemplary embodiment of the present disclosure.

In this state, semiconductor chip 3 and substrate 2 are heated through bonding head 51 and stage 52 so as to heat solder bump 6 and individual sheet 42. The heating temperature is appropriately decided according to the composition of solder bump 6 and the composition of the acrylic composition for sealing. For example, the maximum heating temperature ranges from 180° C. to 300° C. both inclusive. When solder bump 6 and individual sheet 42 are thus heated, solder bump 6 is melted to electrically connect bump electrode 31 and conductor wiring 21 to each other. In addition, individual sheet 42 is melted and then thermally cured to form sealing material 4 as shown in FIG. 4C, and sealing material 4 seals the gap between semiconductor chip 3 and substrate 2. In this process, in the present exemplary embodiment, since sheet material 41 has a low minimum melt viscosity, molten individual sheet 42 has high fluidity. Moreover, when the acrylic composition for sealing contains a radical scavenger, particularly the nitroxide compound (E), it is possible to maintain a low-viscosity state of molten individual sheet 42 for a long time. Therefore, in the present exemplary embodiment, sealing material 4 is less likely to have defects such as unfilling and void formation.

Then, as shown in FIG. 4D, bonding head 51 is moved upward and separated from semiconductor chip 3.

Semiconductor chip 3 is mounted on substrate 2 as described above, whereby semiconductor device 1 shown in FIG. 1 is obtained.

After semiconductor device 1 is manufactured as described above, another semiconductor device 1 can be continuously manufactured using the same flip chip bonder 50. In this case, if bonding head 51 is made to support semiconductor chip 3 in chip member 7 for another semiconductor device 1 in a state where bonding head 51 has high temperature, individual sheet 42 may be inconveniently heated and cured before being disposed between semiconductor chip 3 and substrate 2. Therefore, it is preferable to cool bonding head 51 and then make bonding head 51 support semiconductor chip 3 in chip member 7. In this process, if much time is spent for cooling bonding head 51, the manufacturing efficiency of semiconductor device 1 may deteriorate. In the present exemplary embodiment, however, when the acrylic composition for sealing contains a radical scavenger, particularly the nitroxide compound (E), since individual sheet 42 does not cure immediately upon heating, individual sheet 42 in an uncured state can be disposed between semiconductor chip 3 and substrate 2 even if bonding head 51 has somewhat high temperature. Therefore, it is possible to reduce the time required for cooling bonding head 51 to improve the manufacturing efficiency of semiconductor device 1.

In semiconductor device 1 obtained as described above, defects such as unfilling and voids in sealing material 4 are suppressed. In addition, since sealing material 4 has high heat resistance and moisture resistance, semiconductor device 1 can have high reliability under high temperature and high humidity conditions.

EXAMPLES

1. Preparation of Examples 1 to 11 and Comparative Examples 1 to 3

Examples 1 to 11 and Comparative Examples 1 to 3 as acrylic compositions for sealing were prepared as follows.

First, components shown in the column of composition in Table 1 were prepared. Acrylic compounds among these components were first weighed, and then stirred and mixed using a disper. Then, components other than modified PPEs and inorganic fillers were added to the mixture of acrylic compounds and mixed to prepare a first liquid mixture. Moreover, the modified PPE was dissolved in methyl ethyl ketone to prepare a second liquid mixture. The first liquid mixture and the inorganic filler were added to the second liquid mixture, and then the resulting mixture was stirred using a disper and then mixed using a bead mill to disperse the inorganic filler. In this manner, an acrylic composition for sealing was prepared. The concentration of methyl ethyl ketone in the acrylic composition for sealing was adjusted to be in a range of 30% by mass to 50% by mass both inclusive.

The details of the components shown in the column of composition in the table are as follows.

Acrylic compound 1: ethoxylated bisphenol A dimethacrylate, manufactured by Shin Nakamura Chemical Co., Ltd., product number: BPE-100

Acrylic compound 2: bisphenol A epoxy acrylate, manufactured by SHOWA HIGHPOLYMER CO., LTD., product number: VR-77

Acrylic compound 3: tricyclodecane dimethanol diacrylate, manufactured by Shin Nakamura Chemical Co., Ltd., product number: A-DCP Acrylic compound 4: trimethylolpropane triacrylate, manufactured by Shin Nakamura Chemical Co., Ltd., product number: A-TMPT Maleic acid-modified polybutadiene: manufactured by Cray Valley, product name: Ricobond 1756

Modified PPE 1: a modified polyphenylene ether resin having the structure represented by the above formula (3) wherein X is a group having the structure represented by the above formula (1) (R is a methyl group), manufactured by SABIC, product number: SA 9000

Modified PPE 2: a modified polyphenylene ether resin having the structure represented by the above formula (3) wherein X is a group having the structure represented by the above formula (2), which is synthesized by the following method Synthesis Method of Modified PPE 2

In a 1-L three-necked flask equipped with a temperature controller, a stirrer, a cooling system, and a dropping funnel, 200 g of polyphenylene ether (manufactured by SABIC Innovative Plastics Co., Ltd., product number: SA90, intrinsic viscosity: 0.083 dl/g, number of hydroxyl groups at the terminal: 1.9 on average, number-average molecular weight: 2000), 30 g of a mixture of p-chloromethylstyrene and m-chloromethylstyrene at a mass ratio of 50:50 (manufactured by Tokyo Chemical Industry Co., Ltd., product name: chloromethylstyrene: CMS), 1.227 g of a phase transfer catalyst (tetra-n-butylammonium bromide), and 400 g of toluene were charged, and the components were gradually heated to 75° C. with stirring. Then, an aqueous alkali metal hydroxide solution (a mixture of 20 g of sodium hydroxide and 20 g of water) was dropped in the three-necked flask over 20 minutes. Then, the contents of the three-necked flask were stirred at 75° C. for 4 hours. Then, the contents of the three-necked flask were neutralized with 10% by mass hydrochloric acid, and then a large amount of methanol was charged into the three-necked flask to deposit a precipitate. The contents of the three-necked flask were filtered to separate the precipitate, and the precipitate was washed three times with a liquid mixture of methanol and water at a mass ratio of 80:20. Then, the resulting product was dried under reduced pressure at 80° C. for 3 hours to give a modified polyphenylene ether resin. As a result of analysis of the product by $^1$H-NMR (400 MHz, CDCl$_3$, TMS), a peak derived from ethenylbenzyl was confirmed at 5 to 7 ppm. As a result, it was confirmed that the product was a modified polyphenylene ether resin having a substituent having a carbon-carbon double bond at a terminal. Specifically, it was confirmed that the product was ethenylbenzylated polyphenylene ether. The molecular weight distribution of the polyphenylene ether resin was measured by gel permeation chromatography. The number-average molecular weight calculated from the molecular weight distribution was 2300.

Bismaleimide resin: manufactured by Designer Molecules Inc., product number: BMI-3000

Thermoplastic resin: a methyl methacrylate-n-butyl methacrylate copolymer, manufactured by Evonik, product name: DYNACOLL AC2740

Inorganic filler: a silica powder, manufactured by Tokuyama Corporation, product number: SSP-01R Nitroxide compound: 2,2,6,6-tetramethyl-1-piperidinoxy free radical, manufactured by Tokyo Chemical Industry Co., Ltd.

Silane coupling agent: 3-glycidoxypropyltrimethoxysilane, manufactured by Shin-Etsu Chemical Co., Ltd., product number: KBM-403

Flux: sebacic acid

Thermal radical polymerization initiator: dicumyl peroxide, manufactured by NOF CORPORATION, product name: PERCUMYL D 2. Evaluation Tests Acrylic compositions for sealing were subjected to the following evaluation tests. The results of these evaluation tests are shown in Table 1.

The acrylic composition for sealing of Comparative Example 3 was not subjected to evaluation based on the premise that the acrylic composition for sealing is molded into a sheet because it remained liquid and did not turn into a sheet in an attempt to produce a sheet material.

(1) Evaluation of Minimum Melt Viscosity

A polyethylene terephthalate film was prepared as a support sheet. A film of the acrylic composition for sealing was formed on the support sheet using a bar coater so that the film may have a wet film thickness of 100 μm, and heated at 80° C. for 30 minutes. Thus, a sheet material having a thickness of 50 μm was produced on the support sheet. A plurality of the sheet materials were laminated, compression-molded using a vacuum laminator, and then cut to prepare a sample having a thickness within a range of 300 μm to 400 μm.

The minimum melt viscosity of the sample within a temperature range of 25° C. to 300° C. was measured using a rheometer (product name: AR2000ex) manufactured by TA Instruments Japan Inc. using a plate made of aluminum and having a diameter of 25 mm under the conditions of a measurement gap of 300 μm, a heating rate of 100° C./sec, a number of revolutions of 2 rpm, and a temperature range of 25° C. to 300° C.

(2) Temperature Width in which Low Viscosity is Maintained

A temperature region in which the sample had a viscosity less than or equal to 200 Pa·s was investigated in a temperature range of 25° C. to 300° C. by the same method as in "Evaluation of minimum melt viscosity", and a difference between the maximum temperature and the minimum temperature in the temperature region was calculated.

(3) Evaluation of Glass Transition Temperature

A polyethylene terephthalate film was prepared as a support sheet. A film of the acrylic composition for sealing was formed on the support sheet using a bar coater so that the film may have a wet film thickness of 100 μm, and heated at 80° C. for 30 minutes. Thus, a sheet material having a thickness of 50 μm was produced on the support sheet. A plurality of the sheet materials were laminated, compression-molded using a vacuum laminator, thermally cured in an oven under the conditions of 150° C. for 2 hours, and then cut to prepare a sample having dimensions of 4 mm×40 mm in plan view and a thickness of 800 mm.

The glass transition temperature of the sample was measured under the conditions of a tensile force of 49 mN and a temperature program of 30° C. to 300° C. at 5° C./min using TMA (thermomechanical analyzer) (model number SS7100) manufactured by Seiko Instruments Inc.

(4) Evaluation of Film Forming Property

A polyethylene terephthalate film was prepared as a support sheet. A film of the acrylic composition for sealing was formed on the support sheet using a bar coater so that the film may have a wet film thickness of 100 μm, and heated at 80° C. for 30 minutes. Thus, a sheet material having a thickness of 50 μm was produced on the support sheet.

As a result, a sample capable of forming a film was evaluated as "A", and a sample incapable of forming a film and still had fluidity was evaluated as "C".

(5) Evaluation of Tackiness and Dicing Property

A polyethylene terephthalate film was prepared as a support sheet. A film of the acrylic composition for sealing was formed on the support sheet using a bar coater so that the film may have a wet film thickness of 100 μm, and heated at 80° C. for 30 minutes. Thus, a sheet material having a thickness of 50 μm was produced on the support sheet.

The tackiness of the sheet material was evaluated by picking up the sheet material using a flip chip bonder. The results were evaluated as follows. A sheet material capable of being picked up at a temperature of 80° C. was evaluated as "A", a sheet material incapable of being picked up at a temperature of 80° C. but capable of being picked up at 30° C. was evaluated as "B", and a sheet material incapable of being picked up at a temperature of 30° C. was evaluated as "C".

The sheet material was cut as follows. The sheet material was overlaid on a silicon wafer having a thickness of 100 μm, and fixed to a dicing frame. The sheet material was diced by cutting together with the silicon wafer using a dicing saw (product name: DFD6341) manufactured by DISCO Corporation to cut out a sample of 7.3 mm×7.3 mm in plan view. The sample was washed and then moisture was volatilized. The sample was observed, and a sample with no sagging nor delamination was evaluated as "A", a sample with sagging but without delamination was evaluated as "B", and a sample with delamination was evaluated as "C". Note that "sagging" means that the cut surface of the sheet material is deformed into a curved surface, and "delamination" means delamination between the silicon wafer and the sheet material.

(6) Evaluation of Voids

Using the acrylic composition for sealing, a semiconductor device was produced as follows.

Walts TEG IP80 (10 mm×10 mm×300 μm) manufactured by WALTS CO., LTD. was prepared as a substrate.

Walts TEG CC80 (7.3 mm×7.3 mm×100 μm) manufactured by WALTS CO., LTD. was prepared as a semiconductor wafer. The semiconductor wafer had 1048 bump electrodes each having a Cu pillar having a height of 30 μm and a solder bump having a height of 15 μm provided on the Cu pillar, and the pitch between adjacent solder bumps was 80 μm.

In addition, a polyethylene terephthalate film was prepared as a support sheet. A film of the acrylic composition for sealing was formed on the support sheet using a bar coater so that the film may have a wet film thickness of 100 μm, and heated at 80° C. for 30 minutes. Thus, a sheet material having a thickness of 45 to 55 μm was produced on the support sheet.

The sheet material was overlaid on a semiconductor wafer, and fixed to a dicing frame. The sheet material was diced together with the semiconductor wafer using a dicing saw (product name: DFD6341) manufactured by DISCO Corporation to cut out a chip member having dimensions of 7.3 mm×7.3 mm×100 μm and including a semiconductor chip and an individual sheet.

As a flip chip bonder, model number FC3000S manufactured by Toray Engineering Co., Ltd. was used. The stage of the flip chip bonder was heated to 150° C., and the substrate was fixed to the stage. The bonding head of the flip chip bonder was made to hold the chip member, and the bonding head was heated to 100° C. In this state, the bonding head was moved close to the stage to overlay the individual sheet in the chip member on the substrate while aligning the bump electrode of the semiconductor chip with the conductor wiring of the substrate. In this state, the semiconductor chip was pressed against the substrate for 2 seconds with a load of 100 N being applied to the semiconductor chip. Then, the temperature of the bonding head was raised to a maximum temperature of 260° C. over 1.0 second. Then, the temperature of the bonding head was held at the maximum temperature for 2 seconds, then the holding of the semiconductor chip by the bonding head was released, and the bonding head was separated from the stage. The time from when the semiconductor chip was disposed on the substrate until the bonding head was separated from the stage was about 4 seconds.

Thus, a test semiconductor device was obtained. Voids in the sealing material in the semiconductor device were examined using a scanning acoustic tomograph (SAT). As a result, a sample with no voids was evaluated as "A", and a sample with any voids was evaluated as "C".

(7) Evaluation of Connectivity

Using the acrylic composition for sealing, a test semiconductor device was produced by the same method as that in the evaluation of voids. The connectivity of the semiconductor device was evaluated as follows. The semiconductor device was cut, and the resulting cross section was polished. A Cu pillar in the semiconductor chip and conductor wiring of the substrate that are connected via the solder bump appeared on the cross section. The dimension of a space between the Cu pillar and the conductor wiring was measured. As a result, a sample having a dimension less than 5 µm was evaluated as "A", a sample having a dimension more than or equal to 5 µm and less than 10 µm was evaluated as "B", and a sample having a dimension more than or equal to 10 µm was evaluated as "C".

(8) Evaluation of Moisture Resistance Reliability

Using the acrylic composition for sealing, a test semiconductor device was produced by the same method as that in the evaluation of voids. The semiconductor device was treated under moisture absorption treatment conditions of MSL Lv 2aA (60° C., 60% RH, 120 hours), and then passed three times through a reflow furnace having a peak temperature of 260° C. Then, the presence or absence of delamination at an interface between the cured product and the semiconductor chip as well as between the cured product and the substrate in the semiconductor device was examined using a scanning acoustic tomograph (SAT). As a result, a sample with no delamination was evaluated as "A", and a sample with any delamination was evaluated as "C".

(9) Temperature Cycle Test

Using the acrylic composition for sealing, a test semiconductor device was produced by the same method as that in the evaluation of voids. The semiconductor device was subjected to a temperature cycle test with one cycle being exposure at −55° C. for 30 minutes and exposure at 125° C. for 30 minutes. The value of electric resistance between a bump electrode and conductor wiring in the vicinity of the outer periphery of the semiconductor device before the test was compared with the same electric resistance value of the semiconductor device after 1000 cycles of the test. A sample with no change between the electric resistance values was evaluated as "A", and a sample with any change between the electric resistance values was evaluated as "C".

TABLE 1

| | | Example | | | | | | |
|---|---|---|---|---|---|---|---|---|
| | | 1 | 2 | 3 | 4 | 5 | 6 | 7 |
| Composition (parts by mass) | Acrylic compound 1 | 4.6 | 4.2 | 3.8 | 3.4 | 2.5 | 4.2 | 4.2 |
| | Acrylic compound 2 | 2.3 | 2.1 | 1.9 | 1.7 | 1.3 | 2.1 | 2.1 |
| | Acrylic compound 3 | 16.8 | 15.2 | 13.7 | 12.2 | 9.1 | 15.2 | 15.2 |
| | Acrylic compound 4 | 0.7 | 0.6 | 0.5 | 0.5 | 0.4 | 0.6 | 0.6 |
| | Maleic acid-modified polybutadiene | 2.6 | 2.4 | 2.2 | 1.9 | 1.4 | 2.4 | 2.4 |
| | Modified PPE 1 | 22.1 | 24.6 | 27.0 | 29.5 | 34.4 | | 24.6 |
| | Modified PPE 2 | | | | | | 24.6 | |
| | Bismaleimide resin | | | | | | | |
| | Thermoplastic resin | | | | | | | |
| | Inorganic filler | 49.1 | 49.1 | 49.1 | 49.1 | 49.1 | 49.1 | 49.1 |
| | Nitroxide compound | | | | | | | 0.030 |
| | Silane coupling agent | 1 | 1 | 1 | 1 | 1 | 1 | 1 |
| | Flux | 0.4 | 0.4 | 0.4 | 0.4 | 0.4 | 0.4 | 0.4 |
| | Thermal radical polymerization initiator | 0.4 | 0.4 | 0.4 | 0.4 | 0.4 | 0.4 | 0.4 |
| Evaluation | Film forming property | A | A | A | A | A | A | A |
| | Tackiness | B | A | A | A | A | A | A |
| | Dicing property | A | A | A | A | A | A | A |
| | Minimum melt viscosity (Pa · s) | 50 | 83 | 87 | 94 | 126 | 85 | 107 |
| | Temperature width in which low viscosity is maintained (° C.) | 115 | 107 | 90 | 79 | 55 | 100 | 120 |
| | Glass transition temperature (° C.) | 173 | 174 | 180 | 179 | 183 | 172 | 175 |
| | Voids | A | A | A | A | A | A | A |
| | Connectivity | A | A | A | A | A | A | A |
| | Moisture resistance reliability | A | A | A | A | A | A | A |
| | Temperature cycle test | A | A | A | A | A | A | A |

| | | Example | | | | Comparative Example | | |
|---|---|---|---|---|---|---|---|---|
| | | 8 | 9 | 10 | 11 | 1 | 2 | 3 |
| Composition (parts by mass) | Acrylic compound 1 | 4.2 | 1.9 | 2.0 | 4.2 | 4.2 | 4.2 | 4.2 |
| | Acrylic compound 2 | 2.1 | 0.9 | 1.0 | 2.1 | 2.1 | 2.1 | 2.1 |
| | Acrylic compound 3 | 15.2 | 11.8 | 6.9 | 15.3 | 15.2 | 15.2 | 39.8 |
| | Acrylic compound 4 | 0.6 | 0.3 | 0.3 | 0.6 | 0.6 | 0.6 | 0.6 |
| | Maleic acid-modified polybutadiene | 2.4 | 2.7 | 2.9 | 2.4 | 2.4 | 2.4 | 2.4 |
| | Modified PPE 1 | 24.6 | 70.7 | 5.9 | 12.3 | | | |
| | Modified PPE 2 | | | | | | | |
| | Bismaleimide resin | | | | 12.3 | 24.6 | | |
| | Thermoplastic resin | | | | | | 24.6 | |
| | Inorganic filler | 49.1 | 10 | 79.2 | 49.1 | 49.1 | 49.1 | 49.1 |
| | Nitroxide compound | 0.060 | | | | | | |
| | Silane coupling agent | 1 | 1 | 1 | 1 | 1 | 1 | 1 |
| | Flux | 0.4 | 0.5 | 0.1 | 0.4 | 0.4 | 0.4 | 0.4 |
| | Thermal radical polymerization initiator | 0.4 | 0.5 | 0.1 | 0.4 | 0.4 | 0.4 | 0.4 |

TABLE 1-continued

| Evaluation | | | | | | | | |
|---|---|---|---|---|---|---|---|---|
| | Film forming property | A | A | A | A | A | A | C |
| | Tackiness | A | A | A | C | C | B | — |
| | Dicing property | A | A | A | A | C | A | — |
| | Minimum melt viscosity (Pa · s) | 107 | 18 | 190 | 65 | 31 | 250 | — |
| | Temperature width in which low viscosity is maintained (° C.) | 135 | 145 | 10 | 115 | 120 | 0 | — |
| | Glass transition temperature (° C.) | 175 | 170 | 200 | 132 | 77 | 80 | — |
| | Voids | A | A | A | A | A | B | — |
| | Connectivity | A | A | A | B | B | C | — |
| | Moisture resistance reliability | A | A | A | A | B | B | — |
| | Temperature cycle test | A | A | A | A | B | B | — |

The acrylic composition for sealing, sheet material, multilayer sheet, cured product, and semiconductor device of the present disclosure can be used in various electronic devices.

The invention claimed is:

1. An acrylic composition for sealing, the acrylic composition comprising:
an acrylic compound;
a polyphenylene ether resin including a radical-polymerizable substituent at a terminal;
maleic acid-modified polybutadiene;
an inorganic filler; and
a thermal radical polymerization initiator, wherein:
the acrylic compound contains a (meth)acrylate having a crosslinked polycyclic structure, a di(meth)acrylate having a structure in which an alkylene oxide is added to a bisphenol skeleton, and an epoxy (meth)acrylate,
a proportion of the (meth)acrylate having a crosslinked polycyclic structure in the acrylic compound ranges from 10% by mass to 50% by mass, inclusive,
a proportion of the di(meth)acrylate having a structure in which an alkylene oxide is added to a bisphenol skeleton in the acrylic compound ranges from 3% by mass to 20% by mass, inclusive, and
a proportion of the epoxy (meth)acrylate in the acrylic compound ranges from 5% by mass to 30% by mass, inclusive.

2. The acrylic composition for sealing according to claim 1, further comprising a nitroxide compound.

3. The acrylic composition for sealing according to claim 1, wherein the radical-polymerizable substituent includes a carbon-carbon double bond.

4. The acrylic composition for sealing according to claim 3, wherein the radical-polymerizable substituent includes a structure represented by formula (1) shown below:

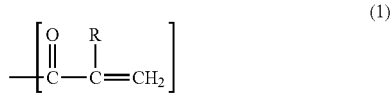

(1)

wherein R is hydrogen or an alkyl group.

5. A sheet material that is a dried product or a half-cured product of the acrylic composition for sealing according to claim 1.

6. The sheet material according to claim 5, having a minimum melt viscosity less than or equal to 200 Pa·s.

7. A multilayer sheet comprising:
the sheet material according to claim 5; and
a support sheet that supports the sheet material.

8. A cured product that is a thermally cured product of the sheet material according to claim 5.

9. The cured product according to claim 8, having a glass transition temperature more than or equal to 170° C.

10. A semiconductor device comprising:
a substrate;
a semiconductor chip mounted face-down on the substrate; and
a sealing material that seals a gap between the substrate and the semiconductor chip,
wherein the sealing material is made of the cured product according to claim 8.

11. A cured product that is a thermally cured product of the acrylic composition for sealing according to claim 1.

12. The cured product according to claim 11, having a glass transition temperature more than or equal to 170° C.

13. A semiconductor device comprising:
a substrate;
a semiconductor chip mounted face-down on the substrate; and
a sealing material that seals a gap between the substrate and the semiconductor chip, wherein the sealing material is made of the cured product according to claim 11.

14. The acrylic composition for sealing according to claim 1, wherein a content ratio of the maleic acid-modified polybutadiene to the acrylic compound is from 10% by mass to 30% by mass, inclusive.

15. The acrylic composition for sealing according to claim 1, wherein the (meth)acrylate having a crosslinked polycyclic structure includes at least one selected from the group consisting of a (meth)acrylate having a dicyclopentadiene skeleton, a (meth)acrylate having a perhydro-1,4:5,8-dimethanonaphthalene skeleton, a (meth)acrylate having a norbornane skeleton, dicyclopentadienyl diacrylate, perhydro-1,4:5,8-dimethanonaphthalene-2,3,7-trimethylol triacrylate, norbornane dimethylol diacrylate, and perhydro-1,4:5,8-dimethanonaphthalene-2,3-dimethylol diacrylate.

16. The acrylic composition for sealing according to claim 1, wherein the (meth)acrylate having a crosslinked polycyclic structure includes at least one of dicyclopentadienyl diacrylate and norbornane dimethylol diacrylate.

17. A method for manufacturing a semiconductor device, the method comprising:
overlaying a sheet material on a surface of a semiconductor wafer including a bump electrode, the surface including the bump electrode, the sheet material being a dried product or a half-cured product of an acrylic composition for sealing, the acrylic composition comprising an acrylic compound,
a polyphenylene ether resin including a radical-polymerizable substituent at a terminal,
an inorganic filler, and
a thermal radical polymerization initiator;
cutting the semiconductor wafer together with the sheet material to produce a member, the member including a semiconductor chip cut out from the semiconductor wafer and an individual sheet cut out from the sheet material;
stacking a substrate including a conductor wiring, the individual sheet, and the semiconductor chip in this order by overlaying the member on a surface of the substrate, the surface including the conductor wiring; and
heating the individual sheet to produce a sealing material by melting and then curing the individual sheet, and to electrically connect the bump electrode to the conductor wiring.

18. A sheet material that is a dried product or a half-cured product of an acrylic composition for sealing, the acrylic composition including:
an acrylic compound;
a polyphenylene ether resin including a radical-polymerizable substituent at a terminal;
an inorganic filler; and
a thermal radical polymerization initiator, wherein:
the acrylic compound contains a (meth)acrylate having a crosslinked polycyclic structure, a di(meth)acrylate having a structure in which an alkylene oxide is added to a bisphenol skeleton, and an epoxy (meth)acrylate,
a proportion of the (meth)acrylate having a crosslinked polycyclic structure in the acrylic compound ranges from 10% by mass to 50% by mass, inclusive,
a proportion of the di(meth)acrylate having a structure in which an alkylene oxide is added to a bisphenol skeleton in the acrylic compound ranges from 3% by mass to 20% by mass, inclusive,
a proportion of the epoxy (meth)acrylate in the acrylic compound ranges from 5% by mass to 30% by mass, inclusive, and
the sheet material has a minimum melt viscosity less than or equal to 200 Pa·s.

19. The sheet material according to claim 18, wherein the sheet material has a minimum melt viscosity more than or equal to 10 Pa·s.

20. A multilayer sheet comprising:
the sheet material according to claim 18; and
a support sheet that supports the sheet material.

21. A cured product that is a thermally cured product of the sheet material according to claim 18.

22. The cured product according to claim 21, having a glass transition temperature more than or equal to 170° C.

23. A semiconductor device comprising:
a substrate;
a semiconductor chip mounted face-down on the substrate; and
a sealing material that seals a gap between the substrate and the semiconductor chip, wherein the sealing material is made of the cured product according to claim 21.

24. The acrylic composition for sealing according to claim 18, wherein the (meth)acrylate having a crosslinked polycyclic structure includes at least one selected from the group consisting of a (meth)acrylate having a dicyclopentadiene skeleton, a (meth)acrylate having a perhydro-1,4:5,8-dimethanonaphthalene skeleton, a (meth)acrylate having a norbornane skeleton, dicyclopentadienyl diacrylate, perhydro-1,4:5,8-dimethanonaphthalene-2,3,7-trimethylol triacrylate, norbornane dimethylol diacrylate, and perhydro-1,4:5,8-dimethanonaphthalene-2,3-dimethylol diacrylate.

25. The acrylic composition for sealing according to claim 18, wherein the (meth)acrylate having a crosslinked polycyclic structure includes at least one of dicyclopentadienyl diacrylate and norbornane dimethylol diacrylate.

* * * * *